United States Patent
Anderson et al.

(10) Patent No.: US 7,341,902 B2
(45) Date of Patent: Mar. 11, 2008

(54) FINFET/TRIGATE STRESS-MEMORIZATION METHOD

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/379,581

(22) Filed: Apr. 21, 2006

(65) Prior Publication Data

US 2007/0249130 A1 Oct. 25, 2007

(51) Int. Cl.
*H01L 21/336* (2006.01)

(52) U.S. Cl. ............ 438/197; 438/283; 438/514; 438/525; 257/E21.4

(58) Field of Classification Search ........... 438/938; 257/E21.4, E21.37, E21.473
See application file for complete search history.

(56) References Cited

U.S. PATENT DOCUMENTS

| | | | |
|---|---|---|---|
| 6,413,802 B1 | 7/2002 | Hu et al. | |
| 6,774,015 B1 | 8/2004 | Cohen et al. | |
| 6,916,694 B2 | 7/2005 | Hanafi et al. | |
| 7,141,456 B2 * | 11/2006 | Lee et al. | 438/135 |
| 2002/0153549 A1 | 10/2002 | Laibowitz et al. | |
| 2003/0146458 A1 | 8/2003 | Horiuchi et al. | |
| 2005/0093030 A1 | 5/2005 | Doris et al. | |
| 2005/0101069 A1 * | 5/2005 | Mathew et al. | 438/151 |

* cited by examiner

*Primary Examiner*—Michael Lebentritt
*Assistant Examiner*—Cheung Lee
(74) *Attorney, Agent, or Firm*—Gibb & Rahman, LLC; William D. Sabo, Esq.

(57) ABSTRACT

Disclosed are embodiments a technique for inducing strain into the polysilicon gate of a non-planar FET (e.g., a finFET or trigate FET) in order to impart a similar strain on the FET channel region, while simultaneously protecting the source/drain regions of the semiconductor fin. Specifically, a protective cap layer is formed above the source/drain regions of the fin in order to protect those regions during a subsequent amorphization ion implantation process. The fin is further protected, during this implantation process, because the ion beam is directed towards the gate in a plane that is parallel to the fin and tilted from the vertical axis. Thus, amorphization of the fin and damage to the fin are limited. Following the implantation process and the formation of a straining layer, a recrystallization anneal is performed so that the strain of the straining layer is 'memorized' in the polysilicon gate.

20 Claims, 8 Drawing Sheets

FINFET/TRIGATE STRESS-MEMORIZATION METHOD

BACKGROUND

1. Field of the Invention

The embodiments of the invention generally relate to a stress memorization method for field effect transistors and, more particularly, to a stress memorization method for fin-type or trigate field effect transistors.

2. Description of the Related Art

The mobility of the charge carriers through the channel region of a metal oxide semiconductor field effect transistor (MOSFET) directly affects performance. Specifically, carrier mobility affects the amount of current or charge which flows, e.g., as electrons or holes, in the channel region. Reduced carrier mobility can reduce the switching speed of a given transistor. Reduced carrier mobility can also reduce the differences between the on and off states and can, therefore, increase susceptibility to noise. Various techniques have been used to improve the charge carrier mobility in such devices.

For example, planar complementary metal oxide semiconductor (CMOS) devices have been able to benefit from increased mobility with a technique known as Stress Memorization Technology. This technology uses mechanical stress control of the channel regions to enhance hole mobility in p-type FETs (p-FETs) and electron mobility in n-type FETs (n-FETs). Uni-axial tensile strain (parallel to the direction of the current) in the channel region increases electron mobility and decreases hole mobility, while uni-axial compressive strain (parallel to the direction of the current) in the channel region increases hole mobility and decreases electron mobility.

Specifically, referring to FIG. 1, the technique begins with a planar FET structure 200. The FET 200 comprises a channel region 230 disposed between source/drain regions 220 in a silicon layer of a wafer and also comprises a polysilicon gate 210 above the channel region 230 (102, see FIG. 2a). After the gate 210 and source/drain regions 220 of the FET 200 are formed, an appropriately selected straining layer 250 is deposited over the FET structure (106, see FIG. 2c). For example, a compressive straining layer can be deposited over a p-FET to and a tensile straining layer can be deposited over an n-FET.

Either before or after the straining layer 250 is formed, an amorphization implant process is performed in order to amorphize both the silicon of the source/drain regions 220 and the gate polysilicon 210 (104, see FIG. 2b). A rapid thermal anneal process is used to re-crystallize the silicon source/drain regions 220 and the polysilicon gate 210 such that the strain of the straining layer 250 is 'memorized' in the silicon and polysilicon of the source/drain regions 220 and gate 210, respectively. By inducing either a tensile or compressive strain into the source/drain regions and into the gate, a similar strain is imparted on the channel region 230 (108). Additionally, the straining layer 250 can be removed (110) and a second straining layer can be deposited on the over the wafer surface with a net benefit above that attainable with just a simple deposited straining film (112).

Unfortunately, this stress memorization technique does not transfer over to non-planar FETs (e.g., dual gate FETs, such as fin-type FETs, or trigate FETs) in a straightforward fashion. Therefore, there is a need in the art for a stress memorization technique suitable for use with non-planar FETs.

SUMMARY

In view of the foregoing, disclosed herein are embodiments of a stress memorization technique suitable for use in the formation of one or more non-planar field effect transistors (FETs), such as fin-type field effect transistors (finFETs) and trigate FETs. The technique induces a selected strain in the polysilicon gate electrode of a non-planar FET in order to impart a similar strain on the FET channel region and, thereby, optimize FET performance, while simultaneously protecting the source/drain regions of the semiconductor fin. Specifically, a protective cap layer is formed on the top surface of the source/drain regions of the fin in order to protect those regions during a subsequent amorphization ion implantation process. The fin is further protected, during this implantation process, because the ion beam is directed towards the gate in a plane that is parallel to the fin and tilted from the vertical axis. Thus, amorphization of and damage to the fin are limited. Following the implantation process (which can occur either before or after the formation of a straining layer), a recrystallization anneal is performed so that the strain of the straining layer is 'memorized' in the polysilicon gate.

More particularly, in one embodiment of the method a non-planar FET (e.g., a finFET or trigate FET) is formed on a substrate. The non-planar FET can comprise a semiconductor fin with source/drain regions at the opposing ends and a channel region disposed between the source/drain regions in the center of the fin. The FET can also comprise a gate over the fin adjacent to the channel region.

A protective layer (e.g., $SiO_2$ or $Si_3N_4$) is formed on the top surface of the semiconductor fin. Depending on the type of FET being formed, the protective layer may be formed either before or after formation of the gate. For example, if the non-planar FET is to be either a finFET or a trigate FET, then the protective layer can be formed after the gate such that the protective layer is only formed above the source/drain regions and not above the channel region. However, if the non-planar FET is to be a finFET, the protective layer may also be formed before the gate such that the protective layer is positioned above both the source/drain regions and the channel region.

As with traditional stress memorization techniques, ions are implanted in order to amorphize the gate. However, the embodiments of the method that are disclosed herein provide a novel technique for implanting the ions in order to further prevent damage to the fin and to limit amorphization of the source/drain regions of the fin. Specifically, the amorphization ion implantation process is accomplished by directing the ions towards the gate in a plane that is parallel to the plane containing the fin and by directing the ions at a non-perpendicular angle to the substrate (i.e., by tilting the ion beam from the vertical axis). The protective layer on the top surface of the fin prevents the ions from being implanted through the top surface of the source/drain regions. Additionally, by directing the ion beam in the same plane as the fin and by tilting the ion beam from the vertical axis, the ions are directed into the opposing sidewalls of the gate and not into the opposing sidewalls of the fin. Thus, damage to the fin as well as complete amorphization of the source/drain regions of the fin is avoided.

An appropriate straining layer is then formed over the gate. Following both the ion implantation process and the formation of the straining layer, a thermal anneal process can be performed in order to re-crystallize the gate as well as those portions of the semiconductor fin which may have been amorphized during the ion implantation process. As mentioned above, this recrystallization process causes the strain of the straining layer to be 'memorized' in the polysilicon gate above the channel region and, thus, imparts a similar strain in the channel region of the fin. Following the recrystallization process, the straining layer may be removed. Optionally, after removing the first straining layer, a second straining layer can be formed over the FET structure and, particularly, over the gate to further enhance the strain in the channel region of the FET.

In another embodiment of the method multiple non-planar FETs are formed on the same substrate. The non-planar FETs can each comprise a semiconductor fin with source/drain regions at the opposing ends and a channel region disposed between the source/drain regions in the center of the fin. The FETs can also each comprise a gate over the fin adjacent to the channel region. Furthermore, the fins for each of the FETs may be oriented in the same direction or in different directions.

Protective layers (e.g., $SiO_2$ or $Si_3N_4$ layers) are simultaneously formed on the top surface of each of the fins. Depending upon the type of FETs being formed using the method of the invention, the protective layers may be formed either before or after gate formation. For example, if the non-planar FETs are to be either finFETs or trigate FETs, then the protective layers can be formed after the gates such that the protective layers are only formed above the source/drain regions and not above the channel regions of the fins. However, if the non-planar FETs are to be finFETs, then the protective layers may also be formed before the gates such that the protective layers are positioned above both the source/drain regions and the channel regions of the fins.

As with traditional stress memorization techniques, ions are implanted into each of the gates. Specifically, the amorphization ion implantation process is accomplished by directing the ions (i.e., directing the ion beam) towards the gates in planes that are parallel to the planes containing the fins and by directing the ions at a non-perpendicular angle to the substrate (i.e., by tilting the beam from the vertical axis).

For example, if the fins (e.g., the first and second semiconductor fins) are oriented in the same direction, the ions can be simultaneously implanted into the gates (e.g., the first and second gates) in order to simultaneously amorphize both gates. That is, the ion beam is directed towards the gates in a plane that is parallel to both semiconductor fins. Furthermore, the ion beam is also directed at a non-perpendicular angle (e.g., between approximately 50 and 80 degrees) to the substrate. The angle is predetermined so that the implantation process is not blocked by any of the other features on the substrate (e.g., by other gates, other devices, etc.).

The protective layers on the top surfaces of the fins prevent the ions from being implanted through the top surfaces of the source/drain regions. Additionally, by directing the ion beam in the same plane as the fins and by tilting the ion beam, the ions are directed into the opposing sidewalls of the gates and not into the opposing sidewalls of the fins. Thus, damage to the fins as well as complete amorphization of the source/drain regions of the fins is avoided.

Alternatively, if the fins (e.g., the first and second semiconductor fins) are oriented in different directions, the amorphization ion implantation process can be accomplished using a masked/stepped process. For example, the second semiconductor fin and gate can be masked. Then, ions can be implanted into the first gate. Specifically, the ions are directed in an ion beam towards the first gate in a first plane that is parallel to the first semiconductor fin. The ions are also directed at a first non-perpendicular angle (e.g., between approximately 50 and 80 degrees) to the substrate. The angle is predetermined so that the implantation process is not blocked by any of the other features on the substrate (e.g., masks, other devices, etc.). The protective layer on the top surface of the first fin prevents the ions from being implanted through the top surfaces of the source/drain regions. Furthermore, by directing the ions in the same plane as the first fin and by tilting the ion beam, the ions are specifically directed towards the sidewalls of the first gate and not towards the sidewalls of the first semiconductor fin.

After the first gate is amorphized, then the second semiconductor fin and gate are unmasked and the first semiconductor fin and gate are masked. The implantation process is then repeated. That is, ions are implanted into the second gate. Specifically, the ions are directed in an ion beam towards the second gate in a second plane that is parallel to the second semiconductor fin. The ions are also directed at a second non-perpendicular angle (e.g., between approximately 50 and 80 degrees) to the substrate. The angle is predetermined so that the implantation process is not blocked by any of the other features on the substrate (e.g., masks, other devices, etc.). The protective layer on the top surface of the second fin prevents the ions from being implanted through the top surfaces of the source/drain regions. Furthermore, by directing the ions in the same plane as the second fin and by tilting the ion beam, the ions are specifically directed towards the sidewalls of the second gate and not towards the sidewalls of the second semiconductor fin. Thus, damage to the fins as well as complete amorphization of the source/drain regions of the fins is avoided.

An appropriate straining layer can then be formed over all the gates. For example, if all of the FETs being formed are to be p-type FETs, then a compressive straining layer (e.g., a compressive nitride layer) can be deposited. Alternatively, if all of the FETs being formed are to be n-type FETs, then a tensile straining layer (e.g., a tensile nitride layer) can be deposited. If both n-FETs and p-FETs are to be formed on the same substrate, then conventional techniques may be used to form a dual strain layer over the substrate such that p-FETs are covered by compressive portions of the dual strain layer and n-FETs are covered by tensile portions of the dual strain layer. Those skilled in the art will recognize that while, it may be preferable to form the straining layer after the gates are amorphized, the straining layer may also be formed before amorphizing the polysilicon gates.

Following both the ion implantation process and the formation of the straining layer, a thermal anneal process can be performed in order to re-crystallize the gates (i.e., the first and second gates) as well as those portions of the semiconductor fins (i.e., the portions of the first and second semiconductor fins) which may have been amorphized during the ion implantation process. As mentioned above, this recrystallization process causes the strain of the straining layer to be 'memorized' in the polysilicon gates and, thus, imparts similar strain into the channel regions in the fins below the gates.

After the recrystallization process, the straining layer may be removed and another straining layer may be formed over the FET structures in order to further enhance the strain in the channel regions of each of the FETs.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 15 is a schematic diagram illustrating a plurality of partially completed non-planar FETs 900a-b formed according to the method of FIG. 8.

DETAILED DESCRIPTION

Figure 1:
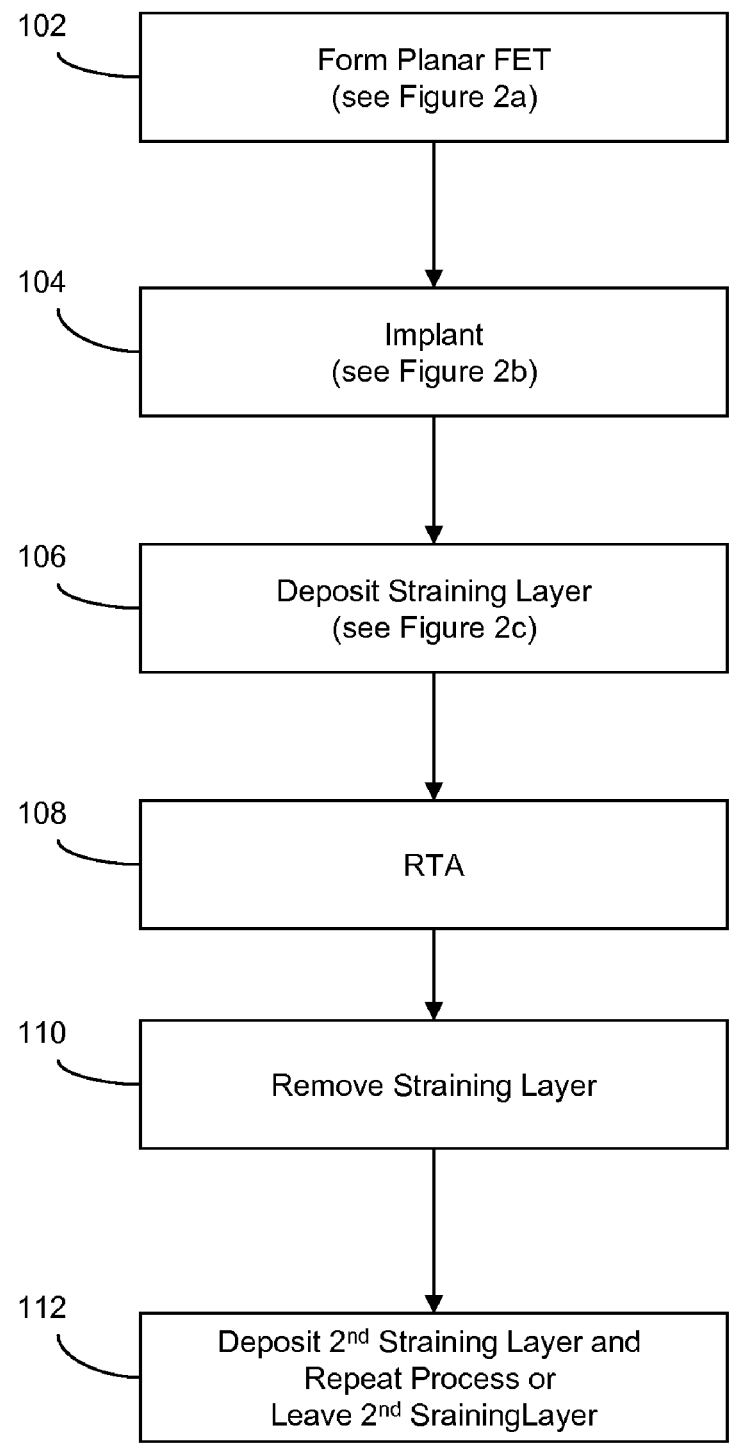
FIG. 1 is flow diagram illustrating a stress memorization technique.
Figure 2A:
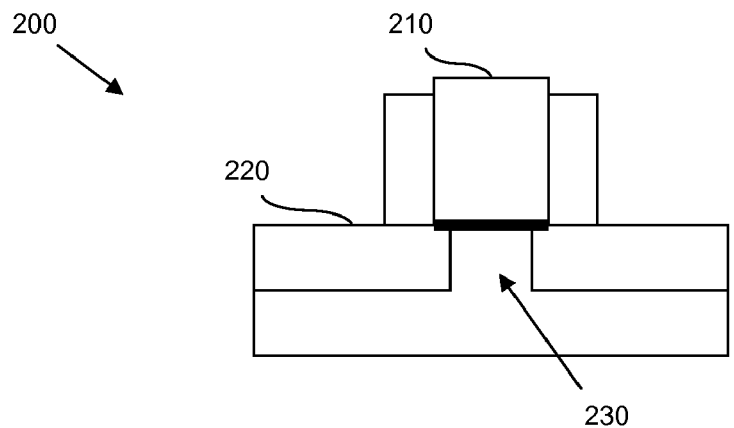
FIGS. 2a-c are schematic diagrams illustrating a partially completed planar FET 200 formed according to the method of FIG. 1.
Figure 2B:
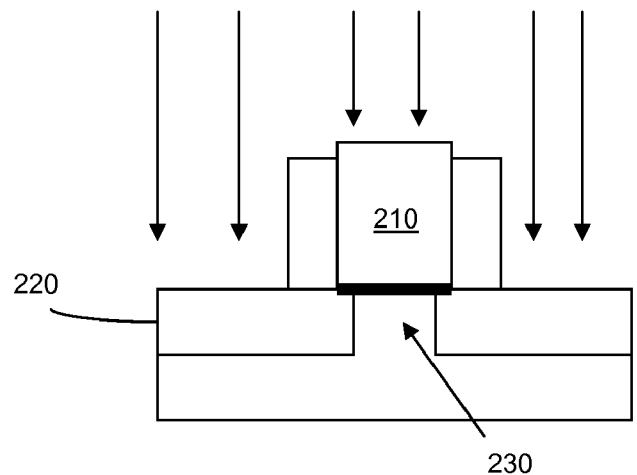
Figure 2C:
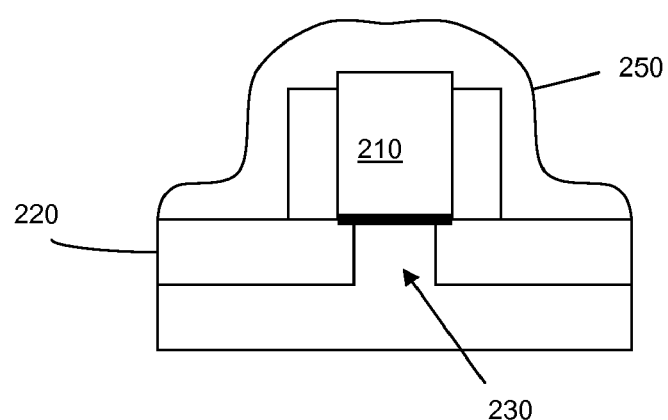

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, various techniques, including the stress memorization technique discussed above and illustrated in the flow diagram of FIG. 1, have been used to improve the charge carrier mobility in planar devices such as, planar complementary metal oxide semiconductor (CMOS) devices. Unfortunately, this stress memorization technique does not transfer over to non-planar FETs such as, dual gate FETs (i.e., fin-type FETs) or trigate FETs, in a straight-forward fashion.

Figure 3A:
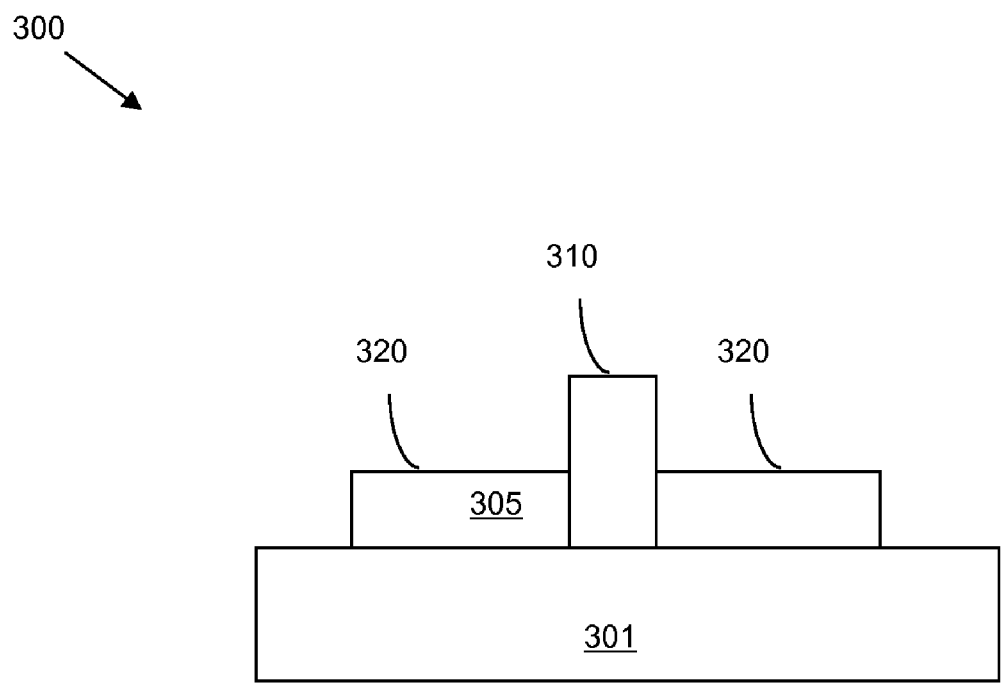
FIGS. 3a-b are cross-section and top view schematic diagrams, respectively, illustrating an exemplary non-planar FET 300.
Figure 3B:
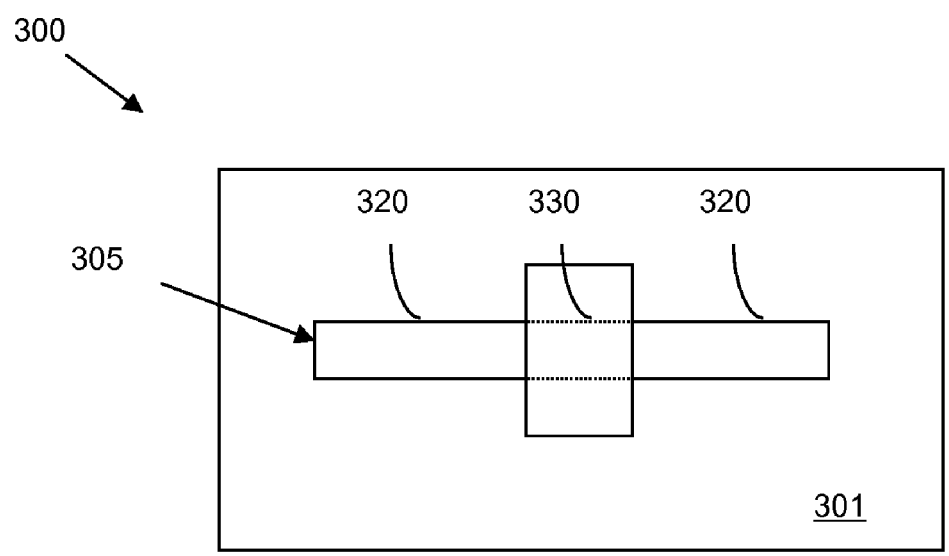

More specifically, referring to FIGS. 3a-b in combination, non-planar FETs 300 are transistors, such as fin-type field effect transistors (finFETs) and trigate FETs, with source/drain regions 320 at the opposing ends of a semiconductor fin 305 and a channel region 330 disposed between the source/drain regions 320 in the center of the fin 305. A gate 310 is formed over the fin 305 adjacent to the channel region 320 (i.e., on the top surface and opposing sidewalls at the center region of the fin).

For a finFET, the fin 305 is thin (e.g., approximately one-fourth the length of the gate 310 (or less)) in order to ensure that the channel region 330 is fully depleted and to ensure suppression of deleterious short-channel effects, such as variability in threshold voltage and excessive drain leakage currents. Thus, the gate 310 adjacent to the channel region 330 provides two-dimensional field effects (i.e., field effects associated with the opposing sides of the fin).

For trigate FETs, the fin 305 is thicker in order to provide three-dimensional field effects (i.e., field effects associated with the opposing sides of the fin as well as the top surface of the fin), but still thin enough to allow the channel region 330 to remain fully depleted (e.g., the fin width to height ratio can range between 3:2 and 2:3). The three-dimensional field effects allow for greater drive current and improved short-channel characteristics over a planar transistor.

The channel region 330 of such non-planar FETs 300 can benefit from stress memorization to enhance carrier mobility; however, the stress memorization technique, discussed above and illustrated in FIG. 1, is not suitable for use with non-planar FETs 300 because the semiconductor fin 305 in a non-planar FET (e.g., a finFET or a trigate FET) is fragile and may be damaged as the polysilicon gate 310 is amorphized by the ion implantation process 104. Additionally, the implantation process 104 may amorphize the source/drain regions 320 of the fin 305 to such an extent that the process 108 of re-crystallizing the fin 305 may be difficult because the fin 305 is not part of a bulk crystalline structure.

In view of the foregoing, disclosed herein are embodiments of a stress memorization technique suitable for use in the formation of one or more non-planar field effect transistors (FETs), such as fin-type field effect transistors (finFETs) and trigate FETs. The technique induces a selected strain in the polysilicon gate electrode of a non-planar FET in order to impart a similar strain on the FET channel region and, thereby, optimize FET performance, while simultaneously protecting the source/drain regions of the semiconductor fin. Specifically, for each FET, a protective cap layer is formed on the top surface of the source/drain regions of the fin in order to protect those regions during a subsequent amorphization ion implantation process. The fin is further protected, during this implantation process, because the ion beam is directed towards the gate in a plane that is parallel to the fin and is tilted from the vertical axis. Thus, amorphization of and damage to the fin are limited. Following the implantation process (which can occur either before or after the formation of a straining layer), a recrystallization anneal is performed so that the strain of the straining layer is 'memorized' in the polysilicon gate.

Figure 4:
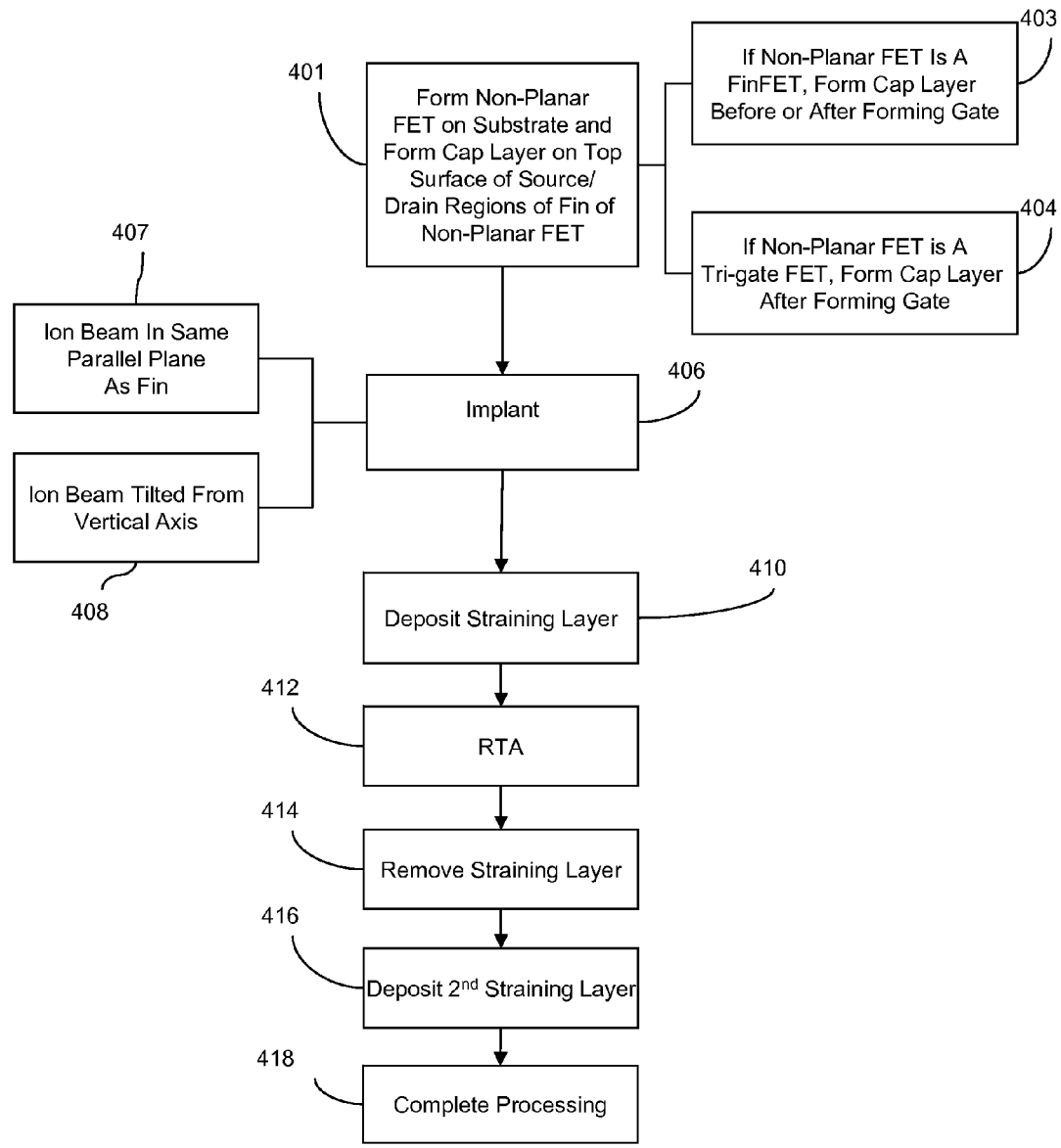
FIG. 4 is a flow diagram illustrating an embodiment of the method of the invention.
Figure 5:
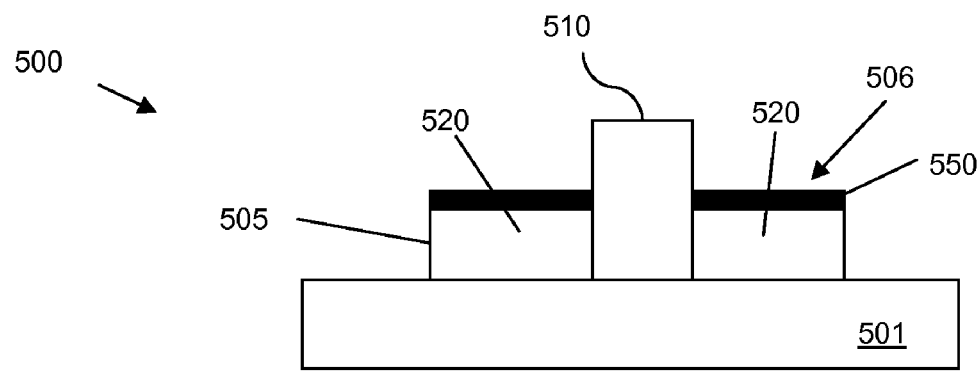
FIG. 5 is a schematic diagram illustrating a partially completed non-planar FET 500 formed according to the method of FIG. 4.
Figure 6:
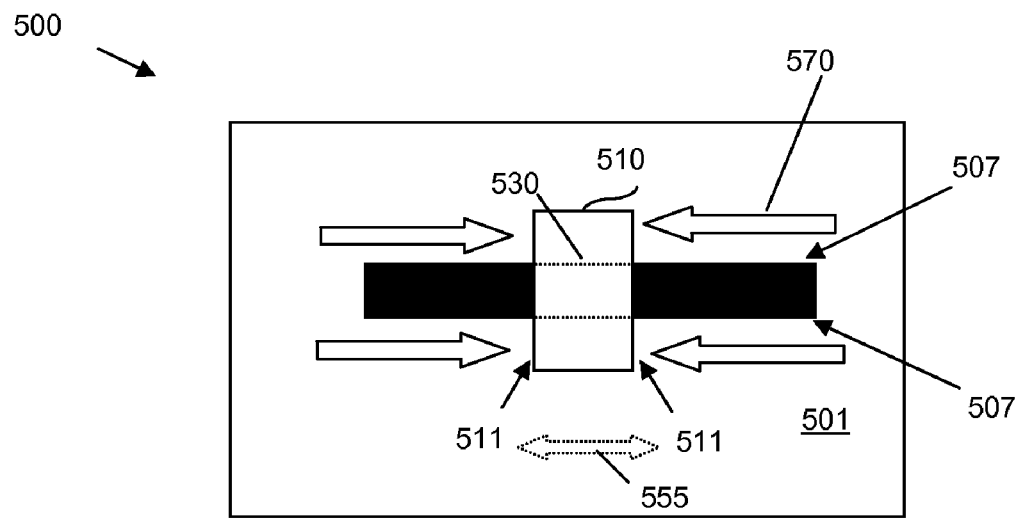
FIG. 6 is a schematic diagram illustrating a partially completed non-planar FET 500 formed according to the method of FIG. 4.

More particularly, referring to FIG. 4, in one embodiment of the method a semiconductor non-planar FET structure (e.g., either finFET structure or a trigate FET structure) is formed on a substrate (401). Specifically, a semiconductor fin 505 may be formed and configured for incorporation into either an n-type or p-type finFET or trigate FET 500 (see FIGS. 5-6). The fin 505 can be formed of silicon and can be formed with source/drain regions 520 on its opposing ends and with a channel region 530 disposed between the source/drain regions. The source/drain regions 520 and channel region 530 can be appropriately doped for either an n-type or p-type FET. Additionally, a gate 510, including a gate dielectric layer and a polysilicon gate conductor, can be formed adjacent to the channel region 530 of the fin 505 (i.e., the gate 510 is formed on the top surface and opposing sidewalls of the center region of the fin 505).

A protective layer 550 is formed on the top surface 506 of the semiconductor fin 606 over the source/drain regions 620 (401). The protective layer 550 can be formed, for example, by depositing either an oxide layer (e.g., SiO₂) or a nitride layer (e.g., Si₃N₄).

Depending upon the type of FET (e.g., either finFET or trigate FET) being formed using the method of the invention, the protective layer may be formed either before or after gate formation (403-404). Specifically, if the non-planar FET 500 is to be either a finFET or a trigate FET, then the protective layer 550 can be formed after the gate 510 such that the protective layer 550 is only positioned above the source/drain regions 520 and not above the channel region 503. However, if the non-planar FET 500 is to be a finFET, the protective layer 550 may also be formed before the gate 510 such that the protective layer 550 is positioned above both the source/drain regions 520 and the channel region 530. Because a finFET exhibits field effects associated with the opposing sides of the channel region and not the top surface, the protective layer above the top surface of the finFET channel region will not interfere with FET performance.

As with traditional stress memorization techniques (see above discussion of FIG. 1), ions are implanted into the gate 510 in order to amorphize the gate 510 (406). That is, ions are accelerated to a required energy using an electric field and directed in an ion beam 570 toward the surface of the gate 510 (see FIG. 6). The energy of the ions determines the depth of the implant and, thus, this energy is predetermined to ensure that the polysilicon gate 510 will be completely amorphized during the implantation process. However, embodiments of the method, disclosed herein, provide a novel technique for implanting the ions in order to further prevent damage to the fin 505 and to limit amorphization of the source/drain regions 520 of the fin 505. Specifically, the amorphization ion implantation process (406) is accomplished by directing the ions (i.e., directing the ion beam 570) towards the gate 510 in a plane 555 that is parallel to the plane containing the fin 505 and by directing the ions at a non-perpendicular angle to the substrate (i.e., by tilting the ion beam 570 from the vertical axis). The protective layer 550 on the top surface 506 of the fin 505 prevents the ions from being implanted through the top surface of the source/drain regions 520. Furthermore, by directing the ion beam 570 in the same plane 555 as the fin 505 and by tilting the ion beam, the ions are directed into the opposing sidewalls 511 of the gate and not into the opposing sidewalls 507 of the fin 505. Thus, damage to the fin 505 as well as complete amorphization of the source/drain regions 520 of the fin 505 is avoided.

Figure 7:
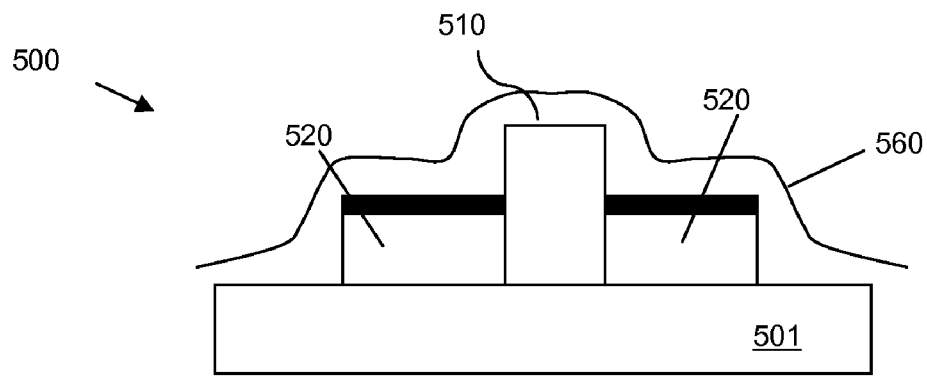
FIG. 7 is a schematic diagram illustrating a partially completed non-planar FET 500 formed according to the method of FIG. 4.

An appropriate straining layer 560 is then formed over the FET structure 500 and, particularly, over the gate 510 (410, see FIG. 7). For example, a compressive straining layer (e.g., a compressive nitride layer) can be deposited over a p-FET or a tensile straining layer (e.g., a tensile nitride layer) can be deposited over an n-FET. Those skilled in the art will recognize that while it may be preferable to form the straining layer after the gate polysilicon is amorphized, the straining layer may also be formed before amorphizing the polysilicon gate.

Following both the ion implantation process (406) and the formation of the straining layer (410), a thermal anneal process can be performed in order to re-crystallize the gate 510 as well as those portions of the semiconductor fin 505 which may have been amorphized during the ion implantation process (412). As mentioned above, this recrystallization process causes the strain of the straining layer 550 to be 'memorized' in the polysilicon gate 510 above the channel region 530 and, thus, imparts a similar strain in the channel region 530 of the fin 505. Following the recrystallization process, the straining layer 550 may be removed (414).

Optionally, after removing the first straining layer 550 (at process 414), a second straining layer can be formed over the FET structure 500 and, particularly, over the gate 510 to further enhance the channel region 530 strain (416).

Once the desired strain is imparted on the channel region 530 of the FET 500, conventional processing techniques may be performed to complete the FET structure 500.

Figure 8:
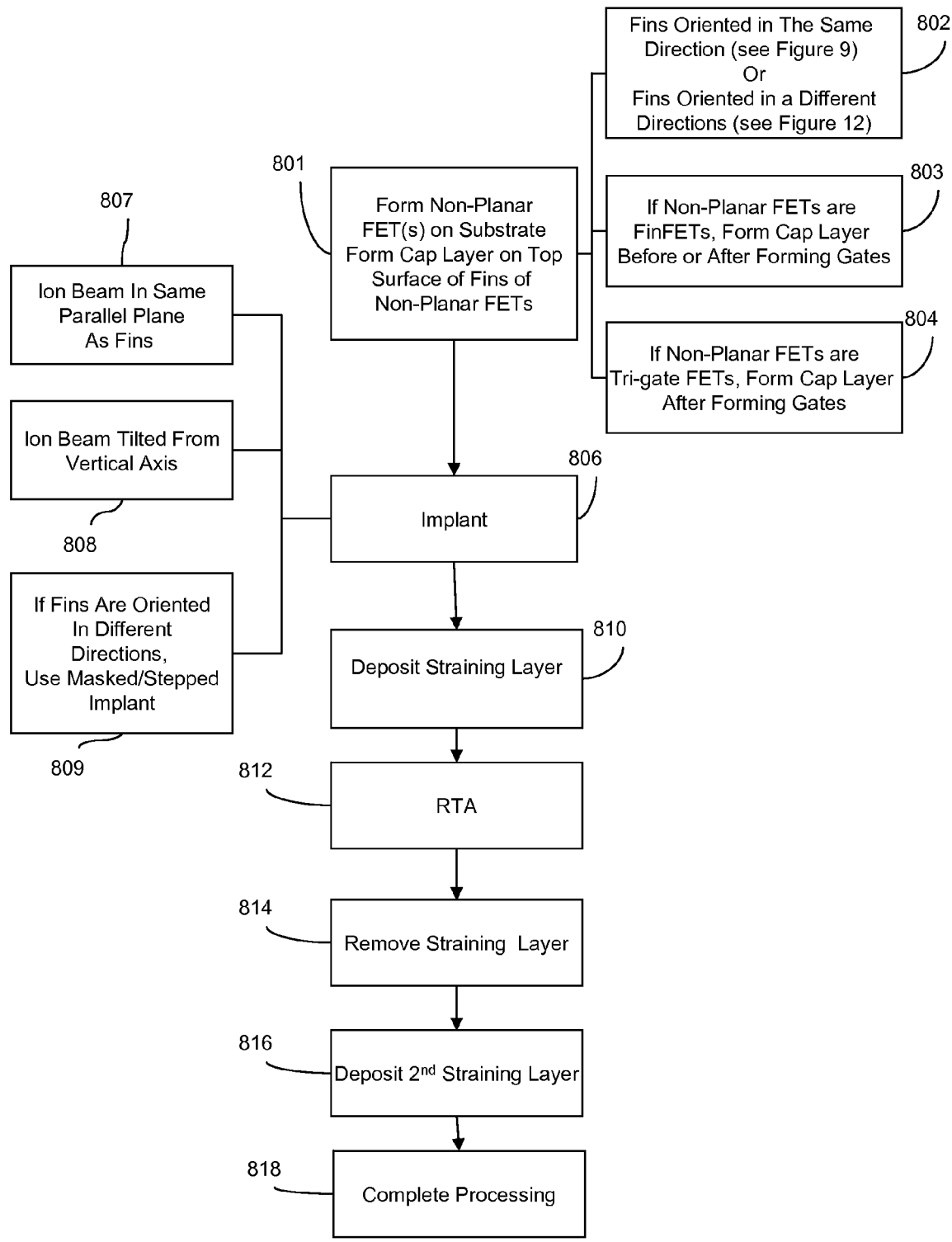
FIG. 8 is a flow diagram illustrating additional embodiments of the method of the invention.

Referring to FIG. 8, in another embodiment of the method multiple non-planar FETs (e.g., multiple finFETs or trigate FETs) are formed on a substrate (801), using conventional processing techniques. The FETs may be formed so that they are oriented in the same direction (see FETs 900a-b of FIGS. 9 and 10) or in different directions (see FETs 1200a-b formed in a chevron pattern in FIG. 12) (802). Specifically, semiconductor fins 905a-b, 1205a-b (i.e., first and second semiconductor fins) are formed on a substrate 901, 1201 and configured for incorporation into p-type and/or n-type finFETs or trigate FETs 900a-b, 1200a-b. The semiconductor fins 900a-b, 1200a-b can be formed of silicon and can each be formed with source/drain regions 920a-b, 1220a-b on their opposing ends and a channel region 930a-b, 1230a-b disposed in the center between the source/drain regions 920a-b, 1220a-b. The source/drain regions 920a-b, 1220a-b and channel region 930a-b, 1230a-b for each fin 905a-b, 1205a-b can be appropriately doped for either an n-type or p-type FET.

Following fin formation, gates 910a-b, 1210a-b, including a gate dielectric layer and a polysilicon gate conductor, are formed adjacent to the channel region 930a-b, 1230a-b of each fin 805a-b, 1205a-b. For example, a first gate 910a, 1210a can be formed adjacent to the first channel region 930a, 1230a of the first fin 905a, 1205a (i.e., on the top surface and opposing sidewalls at the center of the first semiconductor fin). Simultaneously, a second gate 910b, 1210b can be formed adjacent to the second channel region 930b, 1230b of the second semiconductor fin 905b, 1205b (i.e., on the second top surface and second opposing sidewalls at the center of the second semiconductor fin).

Figure 9:
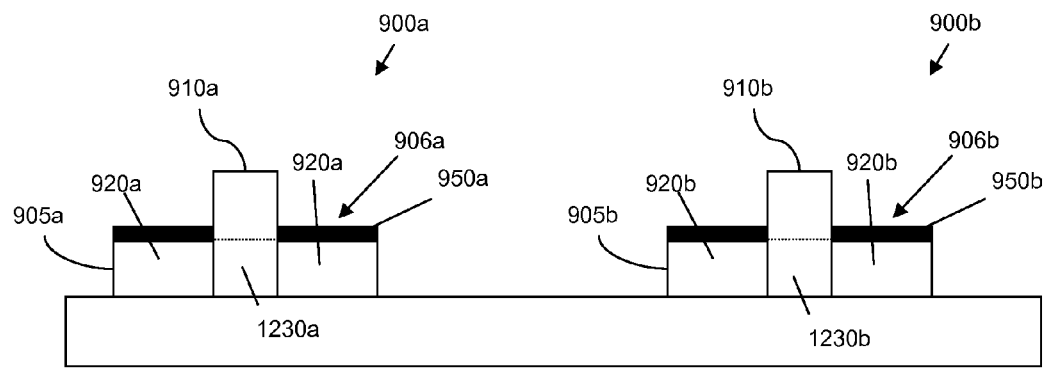
FIG. 9 is a schematic diagram illustrating a plurality of partially completed non-planar FETs 900a-b formed according to the method of FIG. 8.

Protective layers (e.g., see layers 950a-b of FIG. 9) are simultaneously formed on the top surface of each of the fins 905a-b, 1205a-b over the source/drain regions 920a-b, 1220a-b (801). For example, as illustrated in FIG. 9, a first protective layer 950a is formed on the top surface 906a of the first semiconductor fin 905a at the opposing ends and a second protective layer 950b is formed on the top surface 906b of the second semiconductor fin 905b at the opposing ends. The protective layers (e.g., 950a-b) can be formed, for example, by depositing either an oxide layer (e.g., $SiO_2$) or a nitride layer (e.g., $Si_3N_4$).

Depending upon the type of non-planar field effect transistor (e.g., finFETs or trigate FETs) being formed using the method of the invention, the protective layers (e.g., layers 950a-b) may be formed either before or after gate formation (803-804). For example, if the non-planar FETs are to be either finFETs or trigate FETs, then the protective layers can be formed after the gates such that the protective layers are only formed above the source/drain regions and not above the channel regions of the fins. However, if the non-planar FETs are to be finFETs, then the protective layers may also be formed before the gates such that the protective layers are positioned above both the source/drain regions and the channel regions of the fins.

As with traditional stress memorization techniques, ions are implanted into each of the gates in order to amorphize the gates 910a-b, 1210a-b (806). That is, ions are accelerated to a required energy using an electric field and directed in an ion beam toward the surface of the gates. The energy of the ions determines the depth of the implant and, thus, this energy is predetermined to ensure that each of the polysilicon gates will be completely amorphized during the implantation process. However, the embodiments of the method that are disclosed herein provide a novel technique for implanting the ions in order to further prevent damage to the fins and to limit amorphization of the source/drain regions of the fins. Specifically, the amorphization ion implantation process (806) is accomplished by directing the ions (i.e., directing the ion beam) towards the gates in planes that are parallel to the planes containing the fins (807) and by directing the ions at a non-perpendicular angle to the substrate (i.e., by tilting the beam from the vertical axis) (808).

Figure 10:
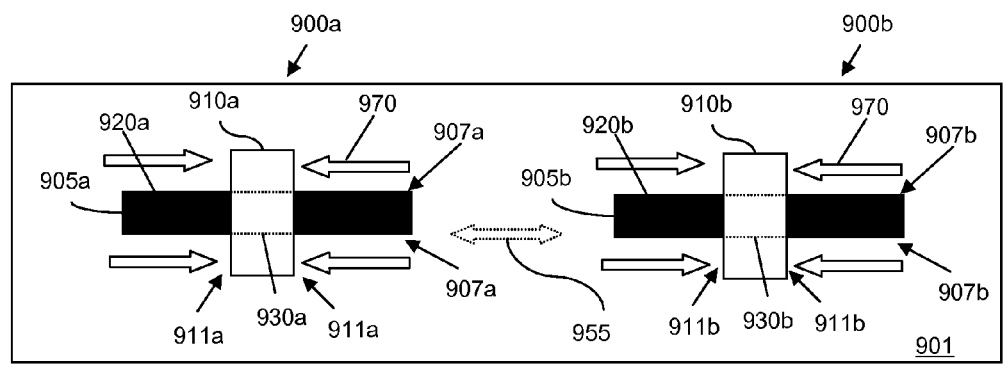
FIG. 10 is a schematic diagram illustrating a plurality of partially completed non-planar FETs 900a-b formed according to the method of FIG. 8.
Figure 11:
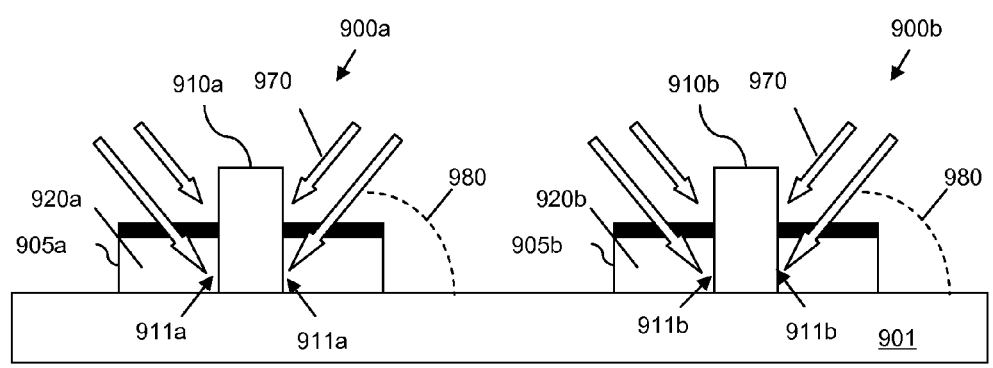
FIG. 11 is a schematic diagram illustrating a plurality of partially completed non-planar FETs 900a-b formed according to the method of FIG. 8.

For example, referring to FIGS. 9-11, if the fins (e.g., the first and second semiconductor fins 905a-b) are oriented in the same direction, the ions can be simultaneously implanted into the gates (e.g., the first and second gates 910a-b) in order to simultaneously amorphize both gates 910a-b. That is, the ion beam 970 is directed towards the gates 910a-b in a plane 955 that is parallel to both semiconductor fins 905a-b (807, see FIG. 10). Furthermore, the ion beam 970 is also directed at a non-perpendicular angle 980 (e.g., between approximately 50 and 80 degrees) to the substrate 901 (808, see FIG. 11). The angle 980 is predetermined so that the implantation process is not blocked by any of the other features on the substrate (e.g., by other gates (as shown in FIG. 11), other devices, etc.).

The protective layers on the top surfaces of the fins 905a-b prevent the ions from being implanted through the top surfaces of the source/drain regions 920a-b. Additionally, by directing the ion beam 970 in the same plane 955 as the fins 905a-b and by tilting the ion beam 970, the ions are directed into the opposing sidewalls 911a-b of the gates 910a-b and not into the opposing sidewalls 907a-b of the fins 905a-b. Thus, damage to the fins 905a-b as well as complete amorphization of the source/drain regions 920a-b of the fins 905a-b is avoided.

Figure 12:
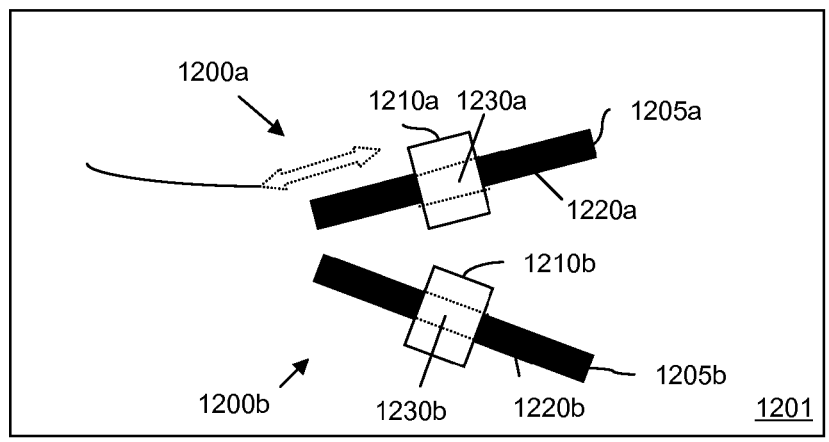
FIG. 12 is a schematic diagram illustrating a plurality of partially completed non-planar FETs 1200a-b formed according to the method of FIG. 8
Figure 13:
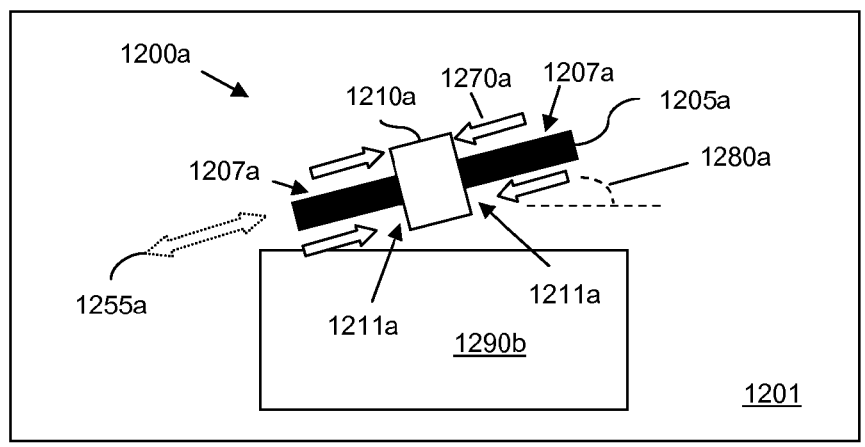
FIG. 13 is a schematic diagram illustrating a plurality of partially completed non-planar FETs 1200a-b formed according to the method of FIG. 8.
Figure 14:
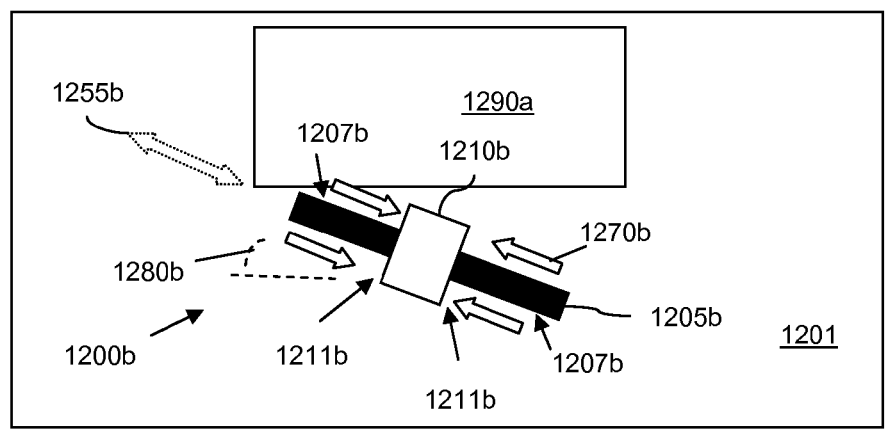
FIG. 14 is a schematic diagram illustrating a plurality of partially completed non-planar FETs 1200a-b formed according to the method of FIG. 8.

Alternatively, referring to FIGS. 12-14, if the fins (e.g., the first and second semiconductor fins 1205a-b) are oriented in different directions (e.g., in a chevron pattern), the amorphization ion implantation process (806) can be accomplished using a masked/stepped process (809). For example, the second semiconductor fin 1205b and gate 1210b can be masked (e.g., see mask 1290b of FIG. 13). Then, ions can be implanted into the first gate 1210a. Specifically, the ions are directed in an ion beam 1270a towards the first gate 1210a in a first plane 1255a that is parallel to the first semiconductor fin 1205a (807). The ions are also directed at a first non-perpendicular angle 1280a (e.g., between approximately 50 and 80 degrees) to the substrate 1201 (808). The angle 1280a is predetermined so that the implantation process is not blocked by any of the other features on the substrate (e.g., mask 1290b (as shown), other devices, etc.). The protective layer 1250a on the top surface of the first fin 1205a prevents the ions from being implanted through the top surfaces of the source/drain regions 1220a. Furthermore, by directing the ions in the same plane 1255a as the first fin 1205a and by tilting the ion beam 1270a, the ions are specifically directed towards the sidewalls 1211a of the first gate 1210a and not towards the sidewalls 1207a of the first semiconductor fin 1205a.

After the first gate 1210a is amorphized, then the second semiconductor fin 1205b and gate are unmasked and the first semiconductor fin 1205a and gate are masked (see mask 1290a of FIG. 14). The implantation process is then repeated. That is, ions are implanted into the second gate 1210b. Specifically, the ions are directed in an ion beam 1270b towards the second gate 1210b in a second plane 1255b that is parallel to the second semiconductor fin 1205b. The ions are also directed at a second non-perpendicular angle 1280b (e.g., between approximately 50 and 80 degrees) to the substrate 1201. The angle 1280b is predetermined so that the implantation process is not blocked by any of the other features on the substrate (e.g., mask 1290a (as shown), other devices, etc.). The protective layer 1250b on the top surface of the second fin 1205b prevents the ions from being implanted through the top surfaces of the source/drain regions 1220b. Furthermore, by directing the ions in the same plane 1255b as the second fin 1205b and by tilting the ion beam 1270b, the ions are specifically directed towards the sidewalls 1211b of the second gate 1210b and not towards the sidewalls 1207b of the second semiconductor fin 1205b. Thus, damage to the fins 1205a-b as well as complete amorphization of the source/drain regions 1220a-b of the fins 1205a-b is avoided. Following the implantation process 806, the first semiconductor fin and gate are unmasked.

An appropriate straining layer can then be formed over all the gates (810) (e.g., see straining layer 960 on gates 910a-b of FETs 900a-b in FIG. 15). Specifically, if all of the FETs 900a-b being formed are to be p-type FETs, then a compressive straining layer 960 (e.g., a compressive nitride layer) can be deposited. Alternatively, if all of the FETs 900a-b being formed are to be n-type FETs, then a tensile straining layer 960 (e.g., a tensile nitride layer) can be deposited. If both n-FETs 900a and p-FETs 900b are to be formed on the same substrate, then conventional techniques may be used to form a dual strain layer over the substrate such that n-FETs 900a are covered by tensile portions 961a of the dual strain layer 960 and p-FETs 900b are covered by compressive portions 961b of the dual strain layer 960. Those skilled in the art will recognize that while, it may be preferable to form the straining layer 960 after the gates 910a-b are amorphized, the straining layer 960 may also be formed before amorphizing the polysilicon gates at process 806.

Following both the ion implantation process (806) and the formation of the straining layer (810), a thermal anneal process can be performed in order to re-crystallize the gates (i.e., the first and second gates) as well as those portions of the semiconductor fins (i.e., the portions of the first and second semiconductor fins) which may have been amorphized during the ion implantation process (812). As mentioned above, this recrystallization process causes the strain of the straining layer to be 'memorized' in the polysilicon gates and, thus, imparts similar strain into the channel regions in the fins below the gates.

After the recrystallization process, the straining layer may be removed (814) and, optionally, another straining layer may be formed over the FET structures in order to further enhance the strain in the channel regions of each of the FETs (816).

Once the desired strain is imparted on the channel regions 930a-b, 1230a-b of the FETs 900a-b, 1200a-b, conventional processing techniques may be performed to complete the FET structures (818).

Therefore, disclosed above are embodiments of a stress memorization technique suitable for use in the formation of one or more non-planar FETs (e.g., finFETs or trigate FETs). The technique induces a selected strain in the polysilicon gate electrode of a non-planar FET in order to impart a similar strain on the FET channel region and, thereby, optimize FET performance, while simultaneously protecting the source/drain regions of the semiconductor fin. Specifically, for each FET, a protective cap layer is formed on the top surface of the source/drain regions of the fin in order to protect those regions during a subsequent amorphization ion implantation process. The fin is further protected, during this implantation process, because the ion beam is directed towards the gate in a plane that is parallel to the fin and is tilted from the vertical axis. Thus, amorphization of and damage to the fin are limited. Following the implantation process (which can occur either before or after the formation of a straining layer), a recrystallization anneal is performed so that the strain of the straining layer is 'memorized' in the polysilicon gate. By forming non-planar FETs according to the method of the invention, FET drive current can be increased, resulting in decreased circuit delay and/or reduced power consumptions. Forming non-planar FETs according to the method of the invention can further be used to increase circuit density and, thus, to reduce production cost can because fewer fins can be incorporated into a circuit to achieve the same switching speed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of forming a field effect transistor, said method comprising:
    forming a gate on a top surface and opposing sidewalls of a semiconductor fin adjacent to a channel region of said fin;
    forming a protective layer on said top surface over source/drain regions of said fin;
    implanting ions into said gate in order to amorphize said gate, wherein said implanting comprises directing said ions towards said gate in a plane parallel to said fin and at a non-perpendicular angle;
    forming a straining layer over said gate; and
    performing a thermal anneal process in order to re-crystallize said gate.

2. The method of claim 1, all the limitations of which are incorporated herein by reference, wherein said forming of said straining layer comprises forming one of a tensile nitride layer and a compressive nitride layer.

3. The method of claim 1, all the limitations of which are incorporated herein by reference, wherein said forming of said straining layer comprises one of forming said straining layer after said implanting of said ions and forming said straining layer before said implanting of said ions.

4. The method of claim 1, all the limitations of which are incorporated herein by reference, wherein said field effect transistor is a fin-type field effect transistor and wherein said forming of said protective layer comprises one of forming said protective layer after said forming of said gate such that said protective layer is only formed above said source/drain regions and forming said protective layer before said forming of said gate such that said protective layer is formed above both said source/drain regions and said channel region.

5. The method of claim 1, all the limitations of which are incorporated herein by reference, wherein said field effect transistor is a trigate field effect transistor and wherein said forming of said protective layer comprises forming said protective layer after said forming of said gate such that said protective layer is only formed above said source/drain regions.

6. A method of forming a field effect transistor, said method comprising:
    forming a gate on a top surface and on opposing sidewalls of a semiconductor fin adjacent to a channel region of said fin;
    forming a protective layer on said top surface over source/drain regions of said fin;
    implanting ions into said gate in order to amorphize said gate, wherein said ions are directed towards said gate in a plane parallel to said fin and at a non-perpendicular angle;
    forming a first straining layer over said gate;
    performing a thermal anneal process in order to re-crystallize said gate;
    removing said first straining layer; and
    forming a second straining layer over said gate.

7. The method of claim 6, all the limitations of which are incorporated herein by reference, wherein said forming of said first straining layer and said forming of said second straining layer each comprise forming one of a tensile nitride layer and a compressive nitride layer.

8. The method of claim 6, all the limitations of which are incorporated herein by reference, wherein said forming of said first straining layer comprises one of forming said first straining layer after said implanting of said ions and forming said first straining layer before said implanting of said ions.

9. The method of claim 6, all the limitations of which are incorporated herein by reference, wherein said field effect transistor is a fin-type field effect transistor and wherein said forming of said protective layer comprises one of forming said protective layer after said forming of said gate such that said protective layer is only formed above said source/drain regions and forming said protective layer before said forming of said gate such that said protective layer is formed above both said source/drain regions and said channel region.

10. The method of claim 6, all the limitations of which are incorporated herein by reference, wherein said field effect transistor is a trigate field effect transistor and wherein said forming of said protective layer comprises forming said protective layer after said forming of said gate such that said protective layer is only formed above said source/drain regions.

11. A method of forming a plurality of field effect transistors, said method comprising:
- forming a first gate on a first top surface and first opposing sidewalls of a first semiconductor fin adjacent to a first channel region of said first fin and forming a second gate on a second top surface and second opposing sidewalls of a second semiconductor fin adjacent to a second channel region of said second fin;
- forming a protective layer on said first top surface over first source/drain regions of said first fin and on said second top surface over second source/drain regions of said second fin;
- implanting ions into said first gate and said second gate in order to simultaneously amorphize said first gate and said second gate, wherein said implanting comprises directing said ions towards said first gate and said second gate in a plane parallel to said first semiconductor fin and said second semiconductor fin and at a predetermined non-perpendicular angle;
- forming a straining layer on said first gate and said second gate; and
- performing a thermal anneal process in order to re-crystallize said first gate and said second gate.

12. The method of claim 11, all the limitations of which are incorporated herein by reference, wherein said forming of said straining layer comprises forming one of a tensile nitride layer, a dual-strain nitride layer, and a compressive nitride layer.

13. The method of claim 11, all the limitations of which are incorporated herein by reference, wherein said field effect transistors are fin-type field effect transistors and wherein said forming of said protective layer comprises one of forming said protective layer after said forming of said first gate and said second gate and forming said protective layer before said forming of said first gate and said second gate.

14. The method of claim 11, all the limitations of which are incorporated herein by reference, wherein said field effect transistors are trigate field effect transistors and wherein said forming of said protective layer comprises forming said protective layer after said forming of said first gate and said second gate.

15. The method of claim 11, all the limitations of which are incorporated herein by reference, wherein said predetermined angle ranges between approximately 50 and 80 degrees.

16. A method of forming a plurality of field effect transistors, said method comprising:
- forming a first gate on a first top surface and first opposing sidewalls of a first semiconductor fin adjacent to a first channel region of said first fin and forming a second gate on a second top surface and second opposing sidewalls of a second semiconductor fin adjacent to a second channel region of said second fin;
- forming a protective layer on said first top surface over first source/drain regions and on said second top surface over second source/drain regions;
- implanting ions into said first gate in order to amorphize said first gate, wherein said implanting comprises directing said ions towards said first gate in a first plane parallel to said first semiconductor fin and at a first non-perpendicular angle;
- implanting said ions into said second gate in order to amorphize said second gate, wherein said implanting comprises directing said ions towards said second gate in a second plane parallel to said second semiconductor fin and at a second non-perpendicular angle;
- forming a straining layer on said first gate and said second gate; and
- performing a thermal anneal process in order to re-crystallize said first gate and said second gate.

17. The method of claim 16, all the limitations of which are incorporated herein by reference, further comprising, before said implanting of said ions into said first gate, masking said second fin and said second gate; and before said implanting of said ions into said second gate, masking said first fin and said first gate.

18. The method of claim 16, all the limitations of which are incorporated herein by reference, further comprising determining said first angle and said second angle to ensure that said implanting of said first gate and said implanting of said second gate are not blocked.

19. The method of claim 16, all the limitation of which are incorporated herein by reference, wherein said forming of said straining layer comprises forming one of a tensile nitride layer, a dual-strain nitride layer and a compressive nitride layer.

20. The method of claim 16, all the limitations of which are incorporated herein by reference, wherein if said field effect transistors are fin-type field effect transistors, then said protective layer can be formed before or after said forming of said first gate and said second gate and wherein if said field effect transistors are trigate field effect transistors, then said protective layer can only be formed after said forming of said first gate and said second gate.

* * * * *